United States Patent [19]

Katagiri et al.

[11] Patent Number: 5,158,827
[45] Date of Patent: Oct. 27, 1992

[54] MATT FILM WITH A ROUGH SURFACE

[75] Inventors: Mikio Katagiri, Tokyo; Tatsuo Kato, Yamaguchi, both of Japan

[73] Assignee: Mitsui Petrochemical Industries, Ltd., Tokyo, Japan

[21] Appl. No.: 748,446

[22] Filed: Aug. 22, 1991

[30] Foreign Application Priority Data

Aug. 22, 1990 [JP] Japan .................................. 2-220682

[51] Int. Cl.$^5$ ........................ B32B 27/38; B32B 27/10
[52] U.S. Cl. .................................... 428/332; 428/512; 428/514; 428/414; 428/418
[58] Field of Search .................... 428/512, 514, 332

[56] References Cited

U.S. PATENT DOCUMENTS 4,543,280  9/1985  Fujita et al. ........................ 428/514
4,959,264  9/1990  Dunk et al. ........................ 428/512

*Primary Examiner*—P. C. Sluby
*Attorney, Agent, or Firm*—Sherman and Shalloway

[57] ABSTRACT

The present invention relates to a matt film comprising a paper and a poly-4-methyl-1-pentene film laminated at least one side of the paper, wherein said poly-4-methyl-1-pentene film has an average surface roughness $R_a$ in the range of 0.5 to 10 μm.

The matt film is suitably applicable to the preparation of cladding panels for multi-layer printed circuit boards.

10 Claims, 3 Drawing Sheets

MATT FILM WITH A ROUGH SURFACE

FIELD OF THE INVENTION

This invention relates to matt films and more particularly to matt films having a rough surface excellent in releasing properties and used in forming cladding panels for multi-layer printed circuit boards.

BACKGROUND OF THE INVENTION

Recently, there has been an increasing demand for miniaturization and polyfunctionalization of electronic equipments, and in view of this trend, various attempts have been made to miniaturize electronic equipments by incorporation thereinto of multi-layer printed circuit boards.

The multi-layer printed circuit boards referred to above have such a construction, for example, as shown in FIG. 6, wherein epoxy resin cured layers 12 and printed circuits 13 are alternately laminated between two sheets of cladding panels 11, 11.

The cladding panel 11 mentioned above usually comprises a copper foil 11a and a resin layer 11b formed on the copper foil 11a. The cladding panel 11 is prepared by laminating a prepreg for forming a resin layer on the copper foil 11a and then curing the prepreg; the prepreg is prepared as a sheet by incorporating reinforcement materials such as glass fiber to a base resin, such as phenolic resin, epoxy resin or polyester resin.

The multi-layer printed circuit boards may be prepared, for example, by the following procedure: the above-mentioned cladding panel 11 having the resin layer 11b, an epoxy resin prepreg 20, a printed circuit 13 and another epoxy resin prepreg 20 are laminated to one another in the manner as shown in FIG. 7, the resulting laminate is sandwiched between 2 pieces of metal plates 21, cushioning materials 22 are individually placed between the press hot plate 23 and jig 21, the epoxy resin prepregs 20 are cured by pressing the laminate by means of two pieces of the press hot plates 23 while heating, and the laminate thus integrated is perforated, followed by through-hole plating and surface etching.

When the multi-layer printed circuit board is prepared in the manner as mentioned above, it is desirable that the surface of the resin layer 11b of the cladding panel 11 is roughened in order to improve adhesion between said resin layer 11b and the epoxy resin cured layer 12 obtained by curing the epoxy resin prepreg 20.

From this reason, cited above, the surface of the resin layer 11b has heretofore been roughened by pressing a film, which has a rough surface and is capable of maintaining its surface roughness even under application of heat against the surface of a prepreg for forming the resin layer 11b of the cladding panel 11 while heating.

Known heretofore as a film used for roughening the surface of the resin layer 11b in the manner as mentioned above is a biaxially oriented film of 1-vinylfluoride polymer of Du Pont, U.S.A. known under a trade name of Tedlar (containing 5% CaCO3; hereinafter called Tedlar film), or a matt film obtained by roughening the surface of a triacetyl cellulose film by means of sand blast.

However, when a cladding panel having a resin layer having a roughened surface is prepared by pressing these conventional matt films to a prepreg for forming a resin layer of the cladding panel while heating, there is observed sometimes such a problem that the filler such as CaCO3 or the dispersing agent for the filler contained in the films migrates to the resin layer or copper foil contacting with said matt films, thereby decreasing the performance of a multi-layer printed circuit board prepared by using this cladding panel.

Under the circumstances, the present inventors proposed in JP-A-32031/1987 a poly-4-methyl-1-pentene film having a roughened surface as the matt film, by the use of which solves the above mentioned problem associated with the conventional matt films.

However, when the surface of the resin layer of the cladding panel 11 is roughened by pressing this matt film of poly-4-methyl-1-pentene to a prepreg for forming the resin layer of the cladding panel while heating, there are sometimes observed such troubles that the matt film expands and wrinkles, or softens in heat and embossed portions on the surface of the matt film are destroyed by the pressure, whereby the surface of the resin layer 11b of the cladding panel 11 cannot be roughened sufficiently.

Accordingly, there has been earnestly desired the advent of such matt films free from wrinkling or free from destruction of embossed portions thereof during the course of the above-mentioned pressing and heating, and which have excellent releasing properties.

OBJECT OF THE INVENTION

The present invention has been made in view of the circumstances as mentioned above, and an object of the invention is to provide matt films which are excellent in releasing properties and capable of forming a resin layer of a cladding panel having a roughened surface by pressing said matt film to a prepreg for forming the resin layer of the cladding panel while heating and curing the prepreg, where the destruction of the embossed portions of the film surface or the wrinkling of the film does not take place at the time of forming the above-mentioned roughened surface of the resin layer of the cladding panel.

SUMMARY OF THE INVENTION

The matt films of the present invention are characterized by comprising a paper sheet and a poly-4-methyl-1-pentene film laminated on at least one side of the paper, wherein said poly-4-methyl-1-pentene film has an average surface roughness $R_a$ of 0.5 to 10 μm.

1 ... Paper sheet
2 ... Poly-4-methyl-1-pentene film

DETAILED DESCRIPTION OF THE INVENTION

The matt films of the present invention are illustrated below in detail.

The matt films of the invention comprise a paper sheet and a poly-4-methyl-1-pentene film laminated on at least one side of the paper, wherein said poly-4-methyl-1-pentene film has an average surface roughness $R_a$ of 0.5 to 10 μm.

Figure 1:
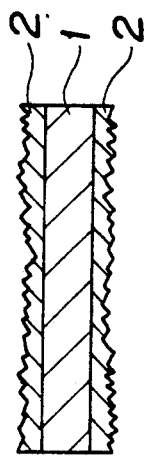
FIGS. 1 and 2 are each a sectional view showing one embodiment of the matt film of the present invention.
Figure 2:

As known in FIG. 1, the matt film of the present invention comprises a paper sheet 1 which is laminated with a poly-4-methyl-1-pentene film 2 on one side of the paper sheet 1, or as shown in FIG. 2, on both sides of the paper sheet 1.

The poly-4-methyl-1-pentene film may be composed of a homopolymer of 4-methyl-1-pentene or a copolymer of 4-methyl-1-pentene and other α-olefin, preferably α-olefin of 2 to 20 carbon atoms, for example, ethylene, propylene, 1-butene, 1-hexene, 1-octene, 1-decene, 1-tetradecene and octadecene. In the latter case, the copolymer desirably contains a structural unit derived from 4-methyl-1-pentene in an amount of at least 85 mol %.

The poly-4-methyl-1-pentene preferably has a melt flow rate, as measured at 260° C. and under a load of 5 kg, in the range of 0.5 to 250 g/10 min, because the poly-4-methyl-1-pentene having such range of melt flow rate has an excellent processability and the film obtained therefrom is excellent in physical properties.

The above-mentioned poly-4-methyl-1-pentene used for forming the poly-4-methyl-1-pentene film 2 may be loaded with fillers such as $CaCO_3$, $BaSO_4$, silica, mica and talc, releasing agents such as silicone oil, or additives such as heat stabilizers, weathering stabilizers, rust preventives and antistatic agents, in such a small amount as not to reduce the efficiency of the final products-cladding panels. The amount of the filler in the poly-4-methyl-1-pentene is preferably not more than 30% by weight and that of the releasing agent is preferably not more than about 6% by weight.

The poly-4-methyl-1-pentene film 2 is desirably oriented, preferably monoaxially oriented, and the draw ratio employed in that case is desirably 2 to 6 times, preferably 3 to 5 times.

The poly-4-methyl-1-pentene film 2 used in the present invention desirably has an average surface roughness $R_a$ of 0.5 to 10 μm, preferably 0.8 to 2 μm.

This poly-4-methyl-1-pentene film 2 has a thickness of 20 to 150 μm, preferably 30 to 70 μm.

Any paper sheet may be used in the matt films of the present invention, for example, the paper sheet 1 may contain fillers, such as clay and kaolin, or sizing agents.

The matt films as shown in FIGS. 1 and 2 as illustrated above may be prepared, for example, by the following manner.

Process 1 for Preparing Matt Film

Figure 3:
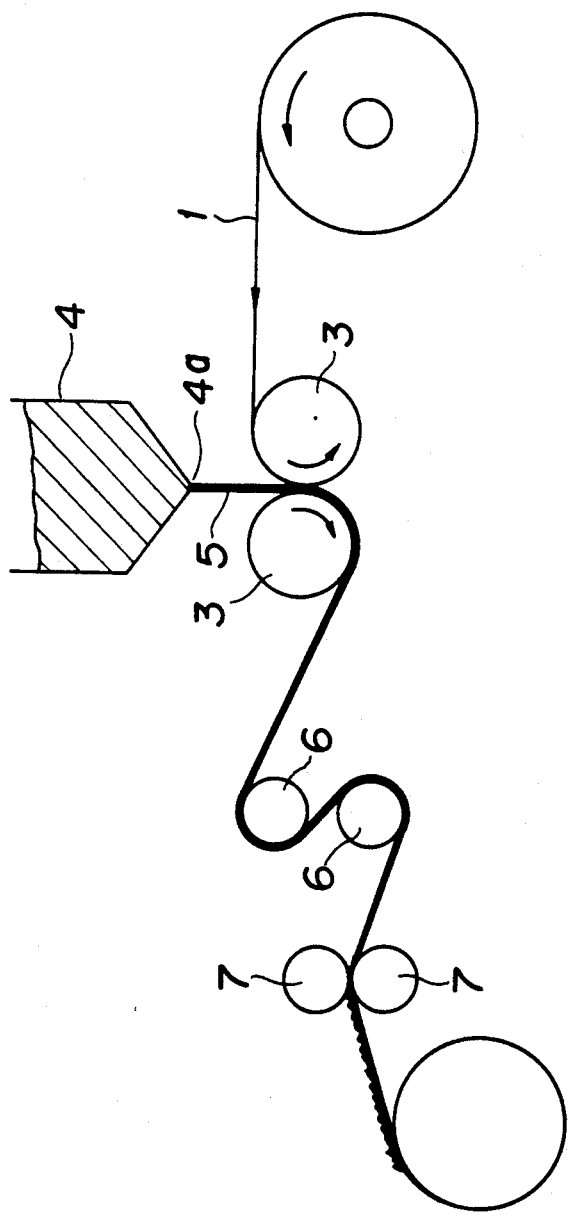
FIGS. 3 to 5 are each a schematic view illustrating the processes for preparing the matt films of the present invention.

In the manner as shown in FIG. 3, a paper sheet 1 in a roll form is allowed to travel horizontally in the lengthwise direction by means of a conveyer such as rollers 3.

In the midway of the conveying route, the paper sheet 1 is laminated with molten poly-4-methyl-1-pentene 5 extruded through a slit-like opening 4a of a laminator 4 arranged above the paper sheet 1.

The poly-4-methyl-1-pentene film thus laminated on the paper sheet 1 is then heated by means of heating rollers 6,6, and the surface of the poly-4-methyl-1-pentene film is then brought into contact under pressure with roughened surfaces of hard rollers 7, 7.

Process 2 for Preparing Matt Film

Figure 4:
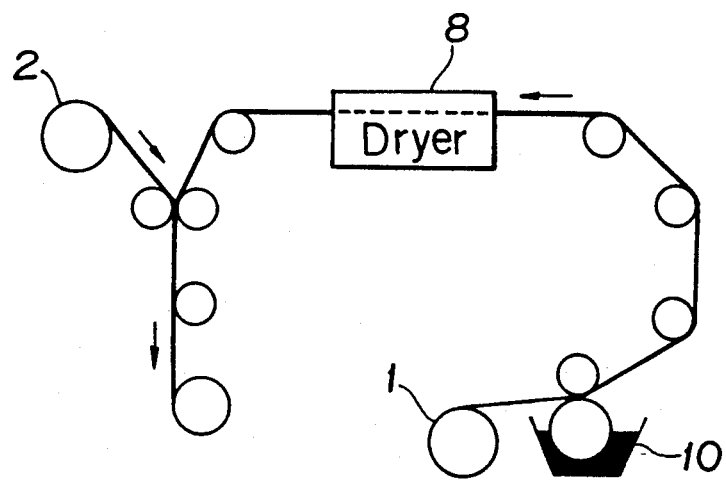

In the manner as shown in FIG. 4, the paper sheet 1 is allowed to travel horizontally in the lengthwise direction.

The paper sheet thus travelling is coated on one side thereof with an adhesive 10, the paper sheet 1 thus coated is allowed to pass through a dryer 8, and the surface of the adhesive 10 coated on the paper sheet 1 is brought into contact under pressure with the back surface of the poly-4-methyl-1-pentene film 2 having a roughened surface.

Process 3 for Preparing Matt Film

Figure 5:
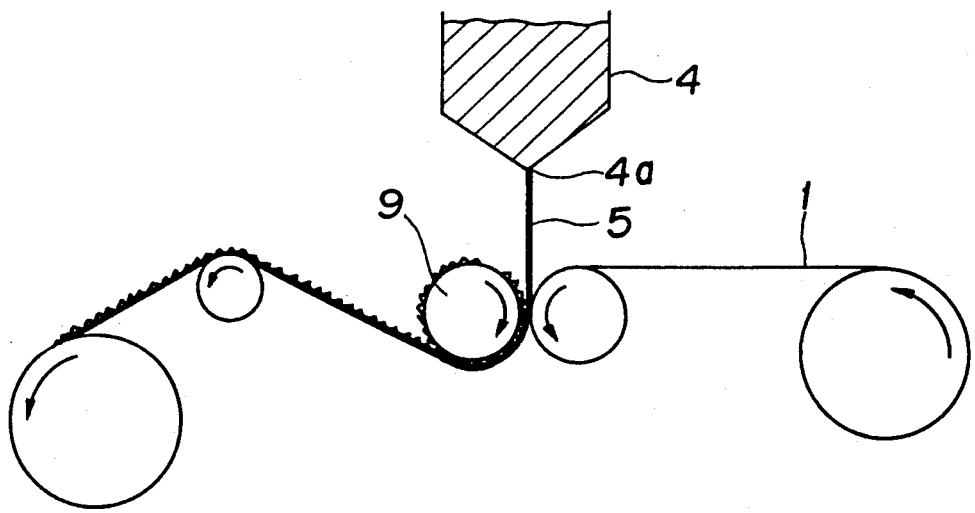
Figure 6:
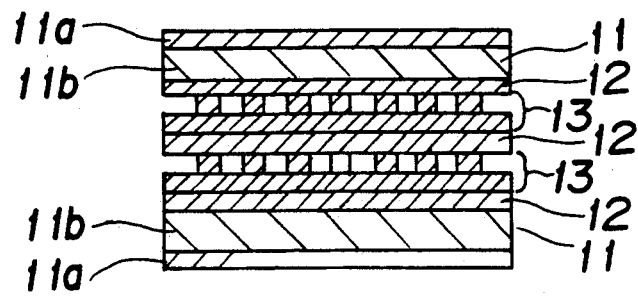
FIG. 6 is a sectional view of a multi-layer printed circuit board.
Figure 7:
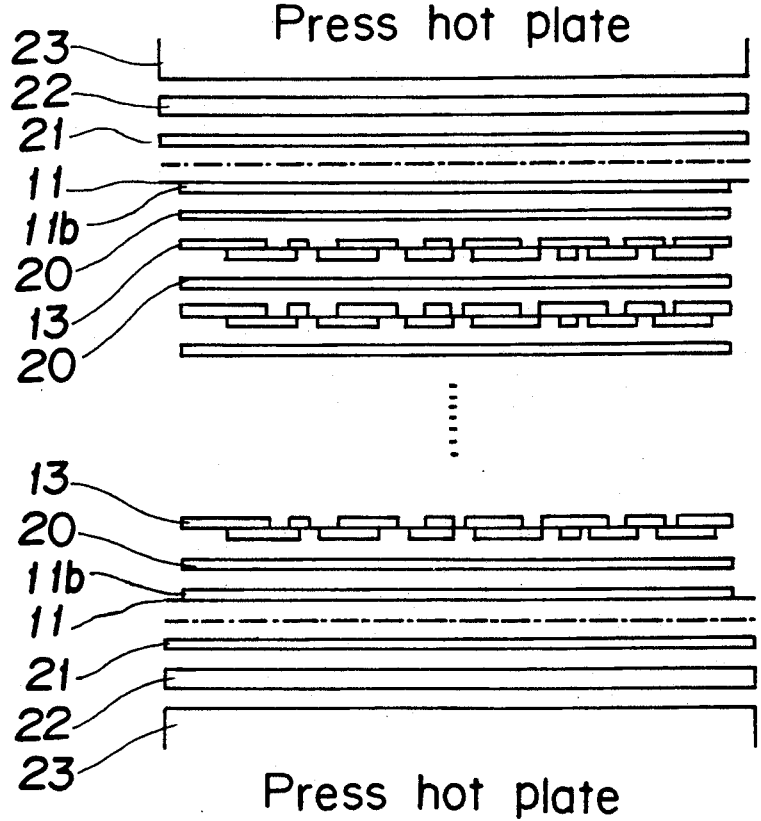
FIG. 7 is a schematic view illustrating the process for preparing a multi-layer printed circuit board.

In the manner as shown in FIG. 5, the paper sheet 1 is coated on one side thereof with molten poly-4-methyl-1-pentene 5 to form a layer composed of poly-4-methyl-1-pentene on the one side of the paper sheet 1.

In that case, by means of an embossing roll 9, the poly-4-methyl-1-pentene is bonded to the paper sheet 1 and simultaneously the surface of this poly-4-methyl-1-pentene is roughened.

EFFECT OF THE INVENTION

The matt films of the present invention have such an effect that when the roughened surface of the poly-4-methyl-1-pentene film is brought into contact under pressure with the prepreg while heating, the embossed portions of the poly-4-methyl-1-pentene film are prevented from their destruction because the paper sheet supporting the said film acts as a cushioning material.

The poly-4-methyl-1-pentene film of the matt film of the invention is also prevented from deformation by virtue of the presence of the paper sheet and thus does not wrinkle. That is to say, in the matt films of the invention, the embossed portions of the poly-4-methyl-1-pentene film does not get out of shape even when the matt film is heated under pressure.

Accordingly, the matt film of the invention makes it possible to form a resin layer having a desired roughened surface by bringing said matt film into contact under pressure with the prepreg, while heating. Thus, the matt films of the invention are suitably applicable to the preparation of the cladding panels having such resin layer as mentioned above for use in the preparation of multi-layer printed circuit boards.

The present invention is illustrated below in detail with reference to examples, but it should be construed that the invention is in no way limited to those examples.

EXAMPLE

A matt film was prepared by bonding a poly-4-methyl-1-pentene embossed film (M604-MT4, a product of Mitsui Petrochemical Ind., Ltd.) to both sides of a paper sheet. The poly-4-methyl-1-pentene embossed film used was oriented monoaxially 4 times, and had the gloss value, average surface roughness $R_a$ and maximum surface roughness $R_{max}$ were as shown in Table 1.

On both sides of the matt film thus prepared were laminated an epoxy prepreg (a product of Mitsubishi Gas Chemical K.K.) and a copper foil in that order.

The laminate thus formed was heated for 30 minutes at a temperature of 130° C. under a pressure of 20 $kg/cm^2$ and then for 60 minutes at a temperature of 180° C. under a pressure of 40 $kg/cm^2$, thereby curing the epoxy prepreg to form an epoxy resin cured layer.

The epoxy resin cured layer thus formed, from which the matt film had been peeled off, was tested to measure its gloss value, average surface roughness $R_a$ and maximum surface roughness $R_{max}$, whereby the results as shown in Table 1 were obtained.

COMPARATIVE EXAMPLES 1 AND 2

As the matt film, there were used a Tedlar film of Du Pont in Comparative Example 1, and a matt film made of polymethyl pentene (X-22 MT4, a product of Mitsui Petrochemical Ind., Ltd.) in Comparative Example 2. These matt films used had their respective gloss value, average surface roughness $R_a$ and maximum surface roughness $R_{max}$ as shown in Table 1.

Epoxy resin cured layers were formed respectively on the matt films of Comparative Examples 1 and 2 in the same manner as in Example except that an epoxy prepreg and a copper foil were laminated in this order on one side of the matt film, and a steel foil was laminated on the other side of the matt film.

The epoxy resin cured layers thus formed, from which the matt films of Comparative Examples 1 and 2 had been respectively peeled off, were tested to measure their gloss value, average surface roughness $R_a$ and maximum surface roughness $R_{max}$, whereby the results as shown in Table 1 were obtained.

TABLE 1

|  |  |  | Example | Comparative Example 1 | Comparative Example 2 |
|---|---|---|---|---|---|
| Surface of matte film | Gloss value | Surface/Back | 28.7/25.5 | 7.5/7.6 | 11.2/9.8 |
|  | $R_a$ | Surface/Back | 0.77/0.70 | 0.50/0.52 | 0.77/0.76 |
|  | $R_{max}$ | Surface/Back | 4.8/4.4 | 3.8/3.9 | 5.2/5.1 |
| Cured surface of epoxy resin | Gloss value | Surface/Back | 9.3/9.2 | 8.2 | 14.2 |
|  | $R_a$ | Surface/Back | 1.55/1.77 | 0.83 | 0.77 |
|  | $R_{max}$ | Surface/Back | 9.4/9.8 | 5.8 | 5.2 |
| Appearance of cured surface of epoxy resin |  |  | Not wrinkling | Not wrinkling | Slightly wrinkling |
| Adhesion |  |  | No problem | Sometimes problem | No problem |

As is clear from Table 1, it is understood that a roughened surface having a sufficiently large average surface roughness $R_a$ and maximum surface roughness $R_{max}$ is formed on the epoxy resin cured surface by the use of the matt film of Example of the present invention. In contrast, when the matt film of Comparative Example 1 or 2 is used, any roughened surface having such highly magnified average surface roughness $R_a$ and maximum surface roughness $R_{max}$ as in Example of the present invention is not formed on the epoxy resin cured layer.

The foregoing suggests that when the poly-4-methyl-1pentene film having a roughened surface of the matt film prepared according to Example of the present invention should be brought into contact with the epoxy prepreg and heated under pressure, the embossed portions are not destroyed and retained favorable, whereas in the matt film of Comparative Example 2, the embossed portions of the film are destroyed.

Further, it was observed that no wrinkle is formed on the poly-4-methyl-1-pentene film, when both sides of the matt film of the present invention are brought into contact under pressure with epoxy prepreg, respectively.

What is claimed is:

1. A matt film for forming a rough surface on a resin layer for the manufacture of a multi-layer laminate comprising a paper sheet and a poly-4-methyl-1-pentene film having an average surface roughness $R_a$ of 0.5 to 10 μm laminated on at least one side of the paper.

2. The matt film according to claim 1 wherein said poly-4-methyl-1-pentene film has an average surface roughness $R_a$ in the range of 0.8 to 2 μm.

3. The matt film according to claim 1 wherein said poly-4-methyl-1-pentene film is oriented monoaxially 2 to 6 times.

4. The matt film according to claim 1 wherein said poly-4-methyl-1-pentene film has a thickness of 20 to 150 μm.

5. The matt film according to claim 1 wherein said poly-4-methyl-1-pentene film is laminated on both sides of the paper.

6. A matt film for forming a rough surface on a resin layer of a cladding panel for the manufacture of a multilayer printed circuit board comprising a paper sheet and a 20 to 150 μm thick poly-4-methyl-1-pentene film having an average surface roughness $R_a$ of 0.50 to 10 μm laminated on at least one side of the paper.

7. The matt film according to claim 6 wherein said poly-4-methyl-1-pentene film has an average surface roughness $R_a$ in the range of 0.8 to 2 μm.

8. The matt film according to claim 6 wherein said poly-4-methyl-1-pentene film is oriented monoaxially 2 to 6 times.

9. The matt film according to claim 6 wherein said poly-4-methyl-1-pentene film is laminated on both sides of the paper.

10. The matt film according to claim 6 wherein said poly-4-methyl-1-pentene film is 30 to 70 μm. thick.

* * * * *